US010958065B2

(12) United States Patent
Toshiyuki

(10) Patent No.: US 10,958,065 B2
(45) Date of Patent: Mar. 23, 2021

(54) SWITCHING CIRCUIT

(71) Applicant: TOYOTA JIDOSHA KABUSHIKI KAISHA, Toyota (JP)

(72) Inventor: Ken Toshiyuki, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 326 days.

(21) Appl. No.: 16/036,607

(22) Filed: Jul. 16, 2018

(65) Prior Publication Data
US 2019/0027923 A1 Jan. 24, 2019

(30) Foreign Application Priority Data
Jul. 18, 2017 (JP) .............................. JP2017-139379

(51) Int. Cl.
*H02H 7/122* (2006.01)
*H02H 1/00* (2006.01)
*H02M 7/5395* (2006.01)
*H02M 1/088* (2006.01)
*H03K 17/082* (2006.01)
*H02M 1/38* (2007.01)
*H02M 1/00* (2006.01)
*H02M 1/32* (2007.01)

(52) U.S. Cl.
CPC ........ *H02H 7/1227* (2013.01); *H02H 1/0007* (2013.01); *H02H 7/1225* (2013.01); *H02M 1/088* (2013.01); *H02M 1/38* (2013.01); *H02M 7/5395* (2013.01); *H03K 17/0828* (2013.01); *H02M 1/32* (2013.01); *H02M 2001/0009* (2013.01)

(58) Field of Classification Search
CPC .. H02H 7/1225; H02H 7/1227; H02H 1/0007; H02H 3/08; H02M 1/088; H02M 1/32; H02M 7/5395; H02M 2001/0009; H03K 17/0828
USPC ............................................... 361/78, 79, 87
See application file for complete search history.

(56) References Cited

U.S. PATENT DOCUMENTS 9,030,177 B2 * 5/2015 Nakashima ......... H02M 3/1588
323/271
9,048,747 B2 * 6/2015 Ansari ................ H02M 3/1588
(Continued)

FOREIGN PATENT DOCUMENTS

JP          2017022830 A      1/2017

*Primary Examiner* — Yemane Mehari
(74) *Attorney, Agent, or Firm* — Hunton Andrews Kurth LLP

(57) ABSTRACT

A switching circuit includes: a detection wiring configured to receive a potential changing depending on a current of a first switching element; a first circuit connected between the detection wiring and a first having a first time constant, and making the first wiring follow the potential of the detection wiring; a second circuit connected between the detection wiring and a second wiring, having a second time constant larger than the first time constant, and making the second wiring fellow the potential of the detection wiring; a potential maintaining circuit configured to maintain the second wiring at a potential higher than the potential of the first wiring while a current is not flow through the first switching element; and a control circuit configured to turn off the first switching element in a case where the potential of the first wiring exceeds the potential of the second wiring.

6 Claims, 5 Drawing Sheets

(56) References Cited

U.S. PATENT DOCUMENTS

| | | | |
|---|---|---|---|
| 2016/0036433 A1* | 2/2016 | Toshiyuki | H03K 5/24 327/109 |
| 2016/0204631 A1* | 7/2016 | Houston | H02J 7/007 320/162 |
| 2017/0012555 A1* | 1/2017 | Toshiyuki | H03K 17/0828 |

* cited by examiner

SWITCHING CIRCUIT

CROSS-REFERENCE TO RELATED APPLICATION

The present application claims priority to Japanese Patent Application No. 2017-139379 filed on Jul. 18, 2017, which is incorporated herein by reference in its entirety.

TECHNICAL FIELD

The technology disclosed in the present disclosure relates to a switching circuit.

BACKGROUND

A switching circuit has been known that controls a current by switching a switching element. There may be a case where an overcurrent flows through the switching element due to a short-circuit of another element connected to the switching element, or the like. In a case where the overcurrent flows, it is necessary to turn off the switching element as soon as possible to protect the switching element. In one of control methods for protecting the switching element from the overcurrent, the switching element is configured to be turned off when the current flowing through the switching element exceeds a threshold value. However, according to this control method, when the current increases rapidly (i.e., when an increasing rate of the current is extremely high), the current may increase to a still higher value during a period from when the current exceeds the threshold value until when the switching element is turned off, as a result of which the switching element cannot be protected appropriately.

On the other hand, Japanese Patent Application Publication No. 2017-22830 discloses a switching circuit that is configured to turn off a switching element when an increasing rate of the current flowing through the switching element exceeds a threshold value. In this switching circuit, the increasing rate of the current flowing through the switching element is detected by using a parasitic inductance of a wiring to which the switching element is connected. When the increasing rate of the current exceeds the threshold value, the switching element is turned off. In this control method, the switching element is turned off based on the increasing rate of the current before the current flowing through the switching element increases to a high value. Due to this, the switching element can be protected suitably from the overcurrent.

SUMMARY

In the switching circuit in Japanese Patent Application Publication No. 2017-22830, the increasing rate of the currents is detected by using the parasitic inductance of the wiring. However, since a parasitic inductance of a wiring varies in each product, there may be a case where the increasing rate of the current flowing through the switching element cannot be detected accurately. Due to this, the switching element may not be protected appropriately from the overcurrent in some cases. Accordingly, the present disclosure proposes a switching circuit capable of protecting the switching element from overcurrent reliably.

A switching circuit disclosed herein may be configured to switch a first switching element. The switching circuit may comprise: the first switching element, a current detection wiring configured to receive a potential which changes depending on a current flowing through the first switching element; a first circuit connected between the current detection wiring and a first wiring, having a first time constant, and configured to make a potential of the first wiring follow the potential of the current detection wiring; a second circuit connected between the current detection wiring and a second wiring, having a second time constant larger than the first time constant, and configured to make a potential of the second wiring follow the potential of the current detection wiring; a potential maintaining circuit configured to maintain the potential of the second wiring at a potential higher than the potential of the first wiring while the current is not flowing through the first switching element; and a control circuit configured to turn off the first switching element in a case where the potential of the first wiring exceeds the potential of the second wiring.

In this switching circuit, the potential of the current detection wiring changes depending on the current flowing through the first switching element. While a current is not flowing through the first switching element, the potential of the second wiring is maintained at a potential higher than the potential of the first wiring by the potential maintaining circuit. When the first switching element is turned on, current flows through the first switching element. Here, when an increasing rate of the current flowing through the first switching element is high (i.e., in a case where an overcurrent will flow if it is left as it is), the potential of the current detection wiring rapidly increases. The potential of the first wiring increases so as to follow the potential of the current detection wiring due to an operation of the first circuit. The potential of the second wiring increases so as to follow the potential of the current detection wiring due to an operation of the second circuit. In this case, since a time constant of the first circuit (first time constant) is smaller than a time constant of the second circuit (second time constant), the potential of the first wiring increases faster than the potential of the second wiring. Due to this, the potential of the first wiring exceeds the potential of the second wiring. Then, the control circuit forcibly turns off the first switching element, and stops the current flowing through the first switching element. Since the first switching element can be turned off when the current flowing through the first switching element begins to rapidly increase, the overcurrent can be prevented from flowing through the first switching element. Further, in a normal operation as well, when the first switching element is turned on, a current flowing through the first element increases. In this case, since the increasing rate of the current is low, an increasing rate of the potential of the current detection wiring is also low. Due to this, potentials of the first and second wirings increase at a substantially same rate as the increasing rate of the potential of the current detection wiring. In this case, since an initial potential of the second wiring potential maintained by the potential maintaining circuit while a current is not flowing through the first switching element) is higher than an initial potential of the first wiring, the potential of the second wiring is maintained at a potential higher than the potential of the first wiring during when the potentials are increasing. That is, in this case, the potential of the first wiring does not become higher than the potential of the second wiring. Thus, in the normal operation, the control circuit does not turn of the first switching element forcibly. Due to this, the first switching element is turned on and off at normal timings. As such, according to this switching circuit, in a case where the increasing rate of a current is high (i.e., in a case where an overcurrent will flow if it is left as it is), the first switching element can be forcibly turned off, and thereby the first switching element can be protected, and during a period of a normal operation such a normal operation can be continued. Thus, according to this switching circuit, the first switching element can be protected from the overcurrent suitably. Further, since this switching circuit does not use a parasitic element such as a parasitic inductance, a fluctuation of its performance is small. Thus, according to this switching circuit, the first switching element can be protected stably from the overcurrent.

DETAILED DESCRIPTION

Figure 1:
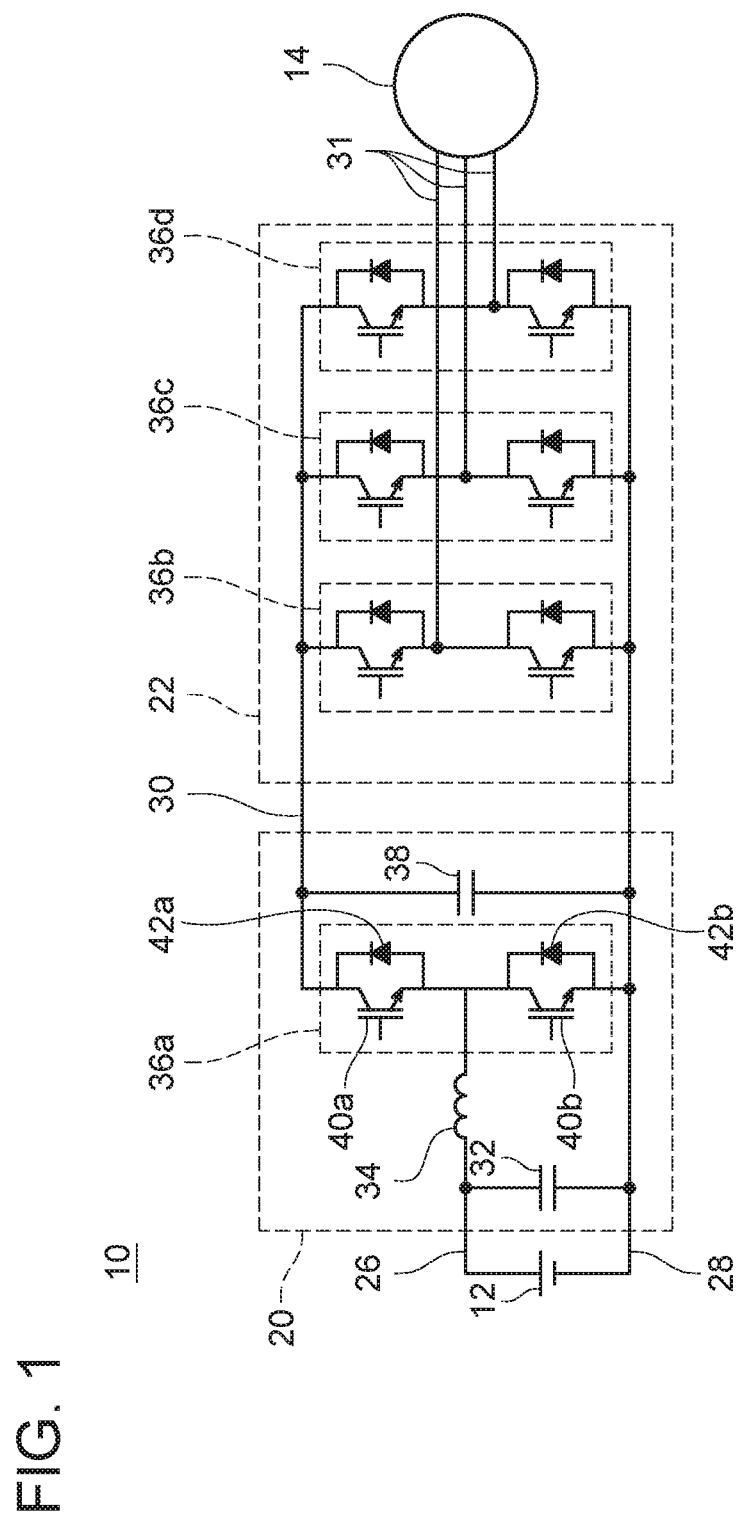
FIG. 1 is a circuit diagram of a motor drive circuit 10.

A switching circuit according to an embodiment is incorporated in a motor drive circuit 10 shown in FIG. 1. The motor drive circuit 10 is mounted in a vehicle. The motor drive circuit 10 is configured to convert a DC power of a battery 12 into a three-phase AC power to supply the converted power to a drive motor 14. The motor drive circuit 10 comprises a converter circuit 20 and an inverter circuit 22. The battery 12 and the converter circuit 20 are connected by a first high-potential wiring 26 and a low-potential wiring 28. The converter circuit 20 and the inverter circuit 22 are connected by a second high-potential wiring 30 and the low-potential wiring 28.

The converter circuit 20 comprises a smoothing capacitor 32, a reactor 34, a series circuit 36a of switching elements, and a smoothing capacitor 38. The reactor 34 is provided on the first high-potential wiring 26. The smoothing capacitor 32 is connected between the low-potential wiring 28 and a portion of the first high-potential wiring 26 on a battery 12 side than the reactor 34. The series circuit 36a is connected in series between the second high-potential wiring 30 and the low-potential wiring 28. The series circuit 36a comprises a switching element 40a and a switching element 40b. In the present embodiment, each of the switching elements 40a and 40b is an IGBT (insulated gate bipolar transistor). It should be noted that other switching elements such as a MOSFET or the like may be employed as the switching elements 40a and 40b. A collector of the switching element 40a is connected to the second high-potential wiring 30. An emitter of the switching element 40a is connected to a collector of the switching element 40b. An emitter of the switching element 40b is connected to the low potential wiring 28. A portion of the first high-potential wiring 26 on a downstream side of the reactor 34 is connected to a wiring between the emitter of the switching element 40a and the collector of the switching element 40b. The series circuit 36a further comprises a diode 42a and a diode 42b. The diode 42a is connected in parallel to the switching element 40a. An anode of the diode 42a is connected to the emitter of the switching element 40a, and a cathode of the diode 42a is connected to the collector of the switching element 40a The diode 42b is connected in parallel to the switching element 40b. An anode of the diode 42b is connected to the emitter of the switching elements 40b, and a cathode of the diode 42b is connected to the collector of the switching element 40b. The smoothing capacitor 38 is connected between the second high-potential wiring 30 and the low-potential wiring 28. The converter circuit 20 turns on the switching element 40a and the switching element 40b complementarily, to thereby step up a DC voltage of the battery 12, and to output the same between the second high-potential wiring 30 and the low-potential wiring 28.

The inverter circuit 22 comprises three series circuits 36b, 36c, and 36d. Each of the series circuits 36b, 36c, and 36d is connected between the second high-potential wiring 30 and the low-potential wiring 28, Each of the series circuits 36b, 36c, and 36d has a configuration substantially same as the configuration of the series circuit 36a. Output wirings 31 are connected to wirings, each of which connects two switching elements in one of the series circuits 36b, 36c, and 36d. Each of the output wirings 31 is connected to the drive motor 14. The inverter circuit 22 switches the switching elements in each of the series circuits 36b, 36c, and 36d, to thereby convert the DC power (output power of the converter circuit 20) between the second high-potential wiring 30 and the low-potential wiring 28 into a three-phase AC power. The three-phase AC power is supplied to the drive motor 14 via the output wirings 31.

Figure 2:
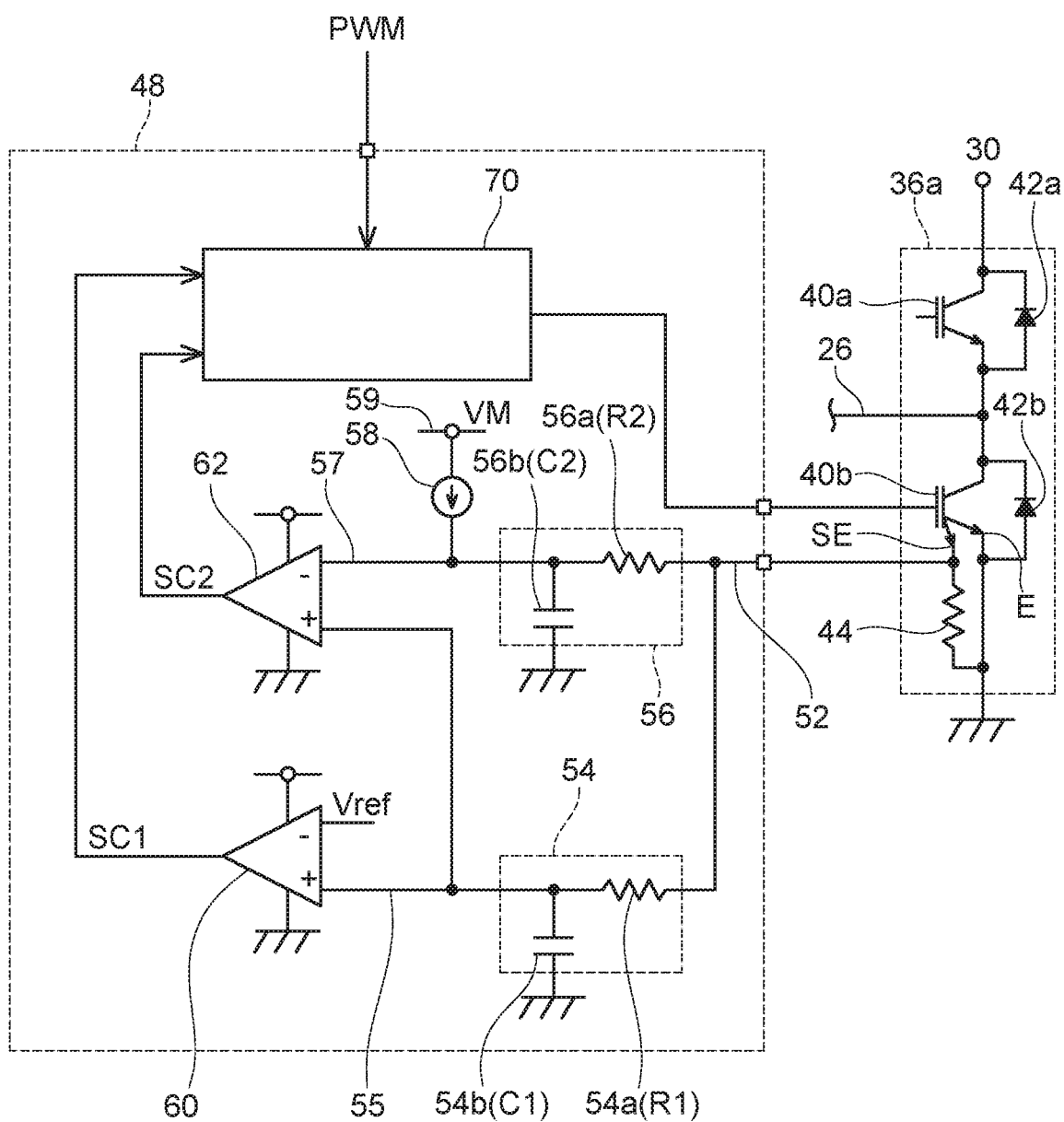
FIG. 2 is a circuit diagram of a switching circuit 50.

FIG. 2 shows the switching circuit 50 configured to control a potential of a gate of the switching element 40b of the series circuit 36a. The switching circuit 50 comprises the switching element 40b and a control board 48. It should be noted that FIG. 2 shows a potential of the low potential wiring 28 as a ground potential.

The series circuit 36a is constituted of a component (so-called power card) in which the switching element 40a, the switching element 40b, the diode 42a, and the diode 42b are sealed in resin. The power card includes a plurality of terminals protruding from an inside toward an outside of the sealing resin. External circuits as well as the control board 48 are connected to the switching elements and the diodes inside of the power card through the terminals of the power card. As shown in FIG. 2, the switching element 40b includes, in addition to an emitter terminal E through which a main current flows, a sense emitter terminal SE through which a current being smaller than the main current flows. Further, the power card includes a current sense resistor 44. The sense emitter terminal SE is connected to the ground potential (i.e., the low-potential wiring 28) via the current sense resistor 44. The emitter terminal E is directly connected to the ground potential (i.e., the low-potential wiring 28). A small current which is substantially in proportion to the main current flowing through the emitter terminal E, flows through the sense emitter terminal SE. The small current flows from the sense emitter terminal SE toward the ground potential via the current sense resistor 44. Thus, a potential of the sense emitter terminal SE is in proportion to the current flowing though the sense emitter terminal SE (i.e., a current flowing through the current sense resistor 44). Thus, the potential of the sense emitter terminal SE is substantially in proportion to the main current flowing through the emitter terminal E (i.e., the main current flowing through the switching element 40b).

The control hoard 48 comprises: a current detection wiring 52, a first filter circuit 54, a first detection wiring 55, a second filter circuit 56, a second detection wiring 57, a constant current source 58, a comparator 60, comparator 62, and a gate control circuit 70.

The gate control circuit 70 is configured to receive a PWM (Pulse Width Modulation) signal inputted from outside. The gate control circuit 70 is configured to control the potential of the gate of the switching element 40b according to the PWM signal to thereby switch the switching element 40b. Further, the gate control circuit 70 is configured to receive an SC1 signal from the comparator 60, and receive an SC2 signal from the comparator 62. Each of the SC1 and SC2 signals has a potential changing between a low potential (hereinafter referred to as LOW) and a high potential (hereinafter referred to as HIGH). The gate control circuit 70 is configured to turn off the switching element 40b in a case where the SC1 signal or the SC2 signal is at HIGH, regardless of the PWM signal. Hereinafter, a turning off operation in this case may be referred to as a forced turning off operation. The forced turning off operation is conducted for protecting the switching element 40b from an overcurrent.

The current detection wiring 52 is connected to the sense emitter terminal, SE of the switching element 40b. Thus, a potential of the current detection wiring 52 has a positive correlation (a relationship where the potential of the current detection wiring 52 increases with the increase of the main current) to the main current flowing through the switching element 40b (the current flowing through the emitter terminal E). More specifically, the potential of the current detection wiring 52 is substantially in proportion to the main current flowing through the switching element 40b.

The first filter circuit 54 is connected between the current detection wiring 52 and the first detection wiring 55. The first filter circuit 54 is a so-called RC series circuit (integration circuit), which includes a resistor 54a and a capacitor 54b. The resistor 54a is connected between the current detection wiring 52 and the first detection wiring 55. The resistor 54a has a resistance of R1. The capacitor 54b is connected between the first detection wiring 55 and the ground potential. The capacitor 54b has a capacitance of C1. Thus, the first filter circuit 54 has a time constant of R1C1. The first filter circuit 54 is configured to make the potential of the first detection wiring 55 follow the potential of the current detection wiring 52 at the time constant R1C1. The first filter circuit 54 functions as a noise filter. The first filter circuit 54 is configured to allow a low-frequency component of the potential of the current detection wiring 52 to pass to the first detection wiring 55, and not to allow a high-frequency component (i.e., a noise) to pass to the first detection wiring 55.

The second filter circuit 56 is connected between the current detection wiring 52 and the second detection wiring 57. The second filter circuit 56 is the so-called RC series circuit (integration circuit), which includes a resistor 56a and a capacitor 56b. The resistor 56a is connected between the current detection wiring 52 and the second detection wiring 57. The resistor 56a has a resistance of R2. The capacitor 56b is connected between the second detection wiring 57 and the ground potential. The capacitor 56b has a capacitance of C2. Thus, the second filter circuit 56 has a time constant of R2C2. The second filter circuit 56 is configured to make the potential of the second detection wiring 57 follow the potential of the current detection wiring 52 at the time constant R2C2. It should be noted that the time constant R2C2 is larger than the time constant R1C1. Accordingly, a potential waveform of the second detection wiring 57 has a gentler form than a potential waveform of the first detection wiring 55. Further, the second filter circuit 56 functions as a noise filter. The second filter circuit 56 is configured to allow a low-frequency component of the potential of the current detection wiring 52 to pass to the second detection wiring 57, and not to allow a high-frequency component a noise) to pass to the second detection wiring 57.

The constant current source 58 is connected between the second detection wiring 57 and a wiring 59 to which a potential VM is applied. The constant current source 58 is configured to make a current of a substantially constant value flow from the wiring 59 to the second detection wiring 57. The current flowing through the constant current source 58 then flows to the ground potential via the second detection wiring 57, the resistor 56a, the current detection wiring 52, and the current sense resistor 44. Due to this, in a case where the potential of the current detection wiring 52 is constant (i.e., in a case where the potential of the current detection wiring 52 does not change), the potential of the second detection wiring 57 is higher than the potential of the current detection wiring 52. On the other hand, in the case where the potential of the current detection wiring 52 is constant, since a current does not flow through the resistor 54a, the potential of the first detection wiring 55 is substantially equal to the potential of the current detection wiring 52. Due to this, in the case where the potential of the current detection wiring 52 is constant, the potential of the second detection wiring 57 is higher than the potential of the first detection wiring 55.

The first detection wiring 55 is connected to a non-inverting input terminal of the comparator 60. An inverting input terminal of the comparator 60 is connected to a reference potential Vref. An output terminal of the comparator 60 is connected to the gate control circuit 70. The comparator 60 is configured to output the signal SC1 to the output terminal based on potentials of the non-inverting input terminal and the inverting input terminal. The signal SC1 is sent to the gate control circuit 70. The comparator 60 controls the signal SC1 at LOW in a case where the potential of the non-inverting input terminal (i.e., the potential of the first detection wiring 55) is equal to or lower than the potential of the inverting input terminal (i.e., the reference potential Vref), and controls the signal SC1 at HIGH in a case where the potential of the non-inverting input terminal is higher than the potential of the inverting input terminal.

The first detection wiring 55 is connected to a non-inverting input terminal of the comparator 62. The second detection wiring 57 is connected to an inverting input terminal of the comparator 62. An output terminal of the comparator 62 is connected to the gate control circuit 70. The comparator 62 is configured to output the signal SC2 to the output terminal based on the potentials of the non-inverting input terminal and the inverting input terminal. The signal SC2 is sent to the gate control circuit 70. The comparator 62 controls the signal SC2 at LOW in a case where the potential of the non-inverting input terminal (i.e., the potential of the first detection wiring 55) is equal to or lower than the potential of the inverting input terminal the potential of the second detection wiring 57), and controls the signal SC2 at HIGH in a case where the potential of the non inverting input terminal is higher than the potential of the inverting input terminal.

As described above, the switching element 40a and the switching element 40b are connected in series between the second high-potential wiring 30 and the low-potential wiring 28. Further, as described above, the switching element 40b is controlled to be repeatedly turned on and off by the gate control circuit 70. The switching element 40a is also controlled to be repeatedly turned on and off by a gate control circuit not shown. The switching element 40a and the switching element 40b are controlled to be alternately turned on, if the switching element 40a and the switching element 40b are turned on simultaneously the second high-potential wiring 30 and the low-potential wiring 28 are short-circuited, as a result which an overcurrent flows through the switching element 40a and the switching element 40b. For this reason, the switching element 40a and the switching element 40b are controlled such that they are not turned-on simultaneously. However, due to a short-circuit fault, the switching element 40a or the switching element 40b may be in a turned-on state at all times. Consequently, there is a risk that the switching element 40a and the switching element 40b are simultaneously turned on, as a result of which the second high-potential wiring 30 and the low-potential wiring 28 may be short-circuited. It should be noted that any of the switching element 40a and the switching element 40b may be short-circuited. However, the description hereinafter will be given to an operation for protecting the switching element 40b in a case where the switching element 40b is normal but the switching element 40a is short-circuited.

There are two types of short-circuit faults in a case where the second high-potential wiring 30 and the low-potential wiring 28 are short-circuited due to a short-circuit fault of the switching element 40a. In a type 1, the switching element 40b is turned on in a state where the switching element 40a is being short-circuited. In a type 2, the switching element 40a is short-circuited in a state where the switching element 40b is turned on. An operation of the switching circuit 50 in each of the type 1 and the type 2 will be hereinafter described.

Figure 3:
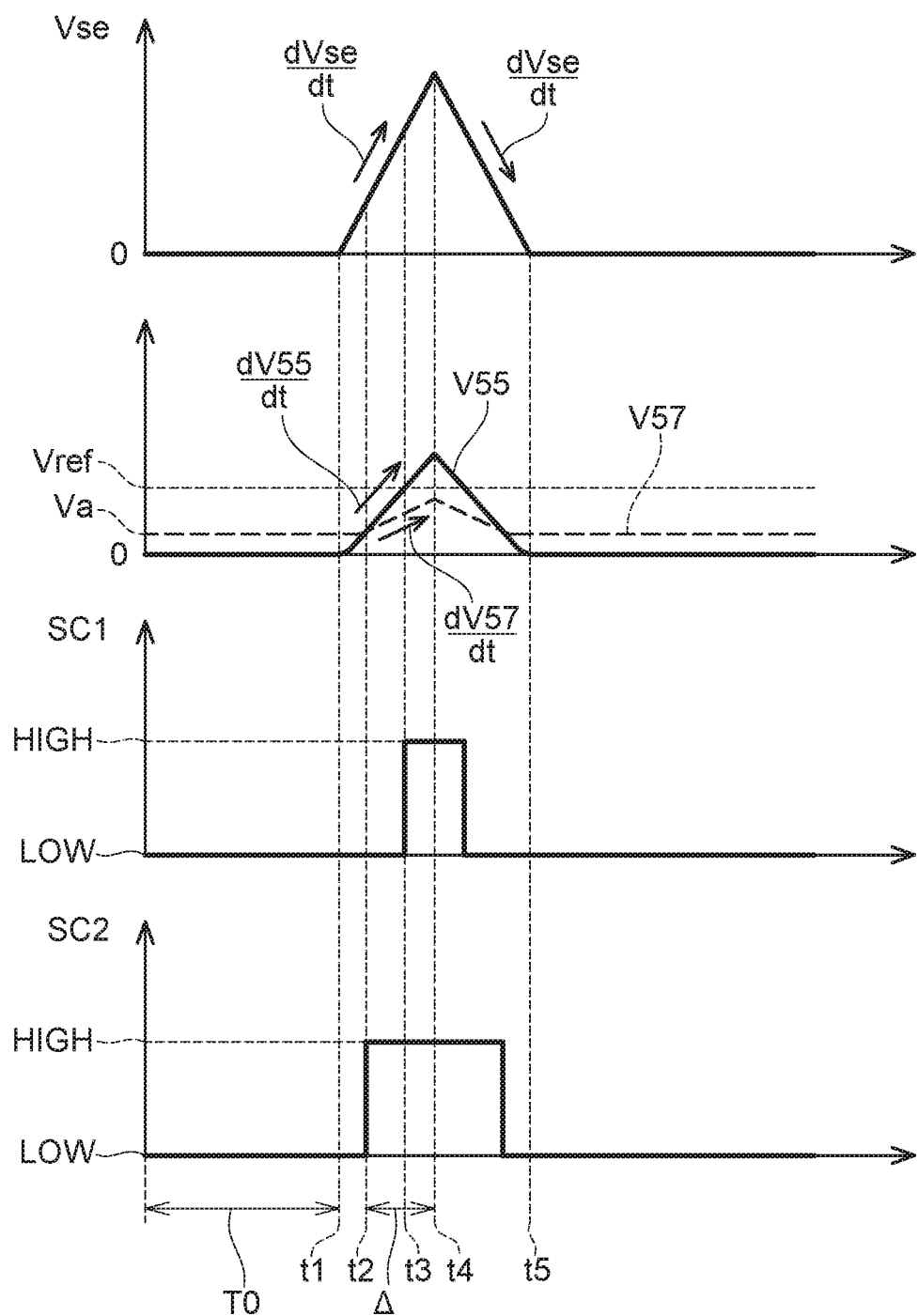
FIG. 3 is a graph showing a change in each value in type 2.

FIG. 3 shows the type 2. It should be noted that in FIG. 3 and FIGS. 4 and 5 to be described later, a reference sign Vse denotes a potential of the sense emitter terminal SE (i.e., the potential of the current detection wiring 52), a reference sign V55 denotes the potential of the first detection wiring 55, and a reference sign V57 denotes the potential of the second detection wiring 57.

FIG. 3 shows a case where the switching element 40a is short-circuited at a timing t1. In FIG. 3, during a time period T0 prior to the timing t1, the switching element 40a is in a turned-off state, and the switching element 40b is in a turned-on state. During the time period T0, since the switching element 40a is turned off a current is not flowing through the series circuit 36a, and the main current flowing through the switching element 40b is substantially zero. Thus, during the time period T0, the potential Vse is maintained at substantially zero. Since during the time period T0 the potential Vse is constant, the potential V55 of the first detection wiring 55 is maintained at a potential substantially equal to the potential Vse (i.e., substantially zero). Due to this, during the time period T0, the potential V55 is lower than the reference potential Vref, and thus the comparator 60 maintains the signal SC1 at LOW. Further, since during the time period T0 the potential Vse is constant, the potential V57 of the second detection wiring 57 is maintained at a potential Va which is slightly higher than the potential Vse due to an influence of the current from the constant current source 58. Accordingly, during the time period T0, the potential V55 is lower than the potential V57. Accordingly, during the time period T0, the comparator 62 maintains the signal SC2 at LOW. It should be noted that the reference potential Vref is set to a potential higher than the potential Va.

At the timing t1, the switching element 40a is short-circuited. Then, the second high-potential wiring 30 and the low-potential wiring 28 are short-circuited, and the main current flowing through the switching element 40b rapidly increases. Due to this, the potential Vse rapidly increases immediately after the timing t1. In this case, since the switching element 40a is short-circuited in a state where the switching element 40b is turned on, the main current increases at a high rate. Due to this, an increasing rate dVse/dt of the potential Vse is also high. After the timing t1, the potential V55 of the first detection wiring 55 and the potential V57 of the second detection wiring 57 also increase with the increase of the potential Vse. However, since the first filter circuit 54 has the time constant R1C1, an increasing rate dV55/dt of the potential V55 is lower than the increasing rate dVse/dt of the potential Vse. Further, since the second filter circuit 56 has the time constant R2C2, an increasing rate dV57/dt of the potential. V57 is lower than the increasing rate dVse/dt of the potential Vse. Further, since the time constant R2C2 is larger than the time constant R1C1, the increasing rate dV57/dt of the potential V57 is lower than the increasing rate dV55/dt of the potential V55. As a result of this, at a timing t2, the potential V55 becomes higher than the potential V57. Then, the comparator 62 raises the signal SC2 from LOW to HIGH. Accordingly, the gate control circuit 70 conducts the forced turning off operation of the switching element 40b. Accordingly, at a timing t4 a little later than the timing t2, the main current (i.e., the potential Vse) flowing through the switching element 40b begins to decrease. The main current (i.e., the potential Vse) decreases from the timing t4 to a timing t5. It should be noted that once the signal SC2 is raised to HIGH, the gate control circuit 70 maintains the switching element 40b in the turned-off state. Due to this, after the timing t5, the main current (i.e., the potential Vse) is maintained at substantially zero.

It should be noted that since at a timing t3 the potential V55 exceeds the reference potential Vref, the comparator 60 raises the signal SC1 from LOW to HIGH. However, since at the timing t2 prior to the timing t3, the signal SC2 was already changed to HIGH, the operation of the circuit is not influenced even if the signal SC2 is changed from LOW to HIGH at the timing t3.

As described above, in the type 2, since the increasing rate dVse/dt of the potential Vse is high, the potential V57 and the potential V55 increase by being delayed to the increase of the potential Vse. Further, the potential V55 increases faster than the potential V57 due to a difference in their time constants. As a result of this, at the timing t2, the potential V55 exceeds the potential V57, and the forced turning off operation is started. Accordingly, at the timing t4, the main current can be decreased. As such, in the type 2 where the increasing rate of the main current (i.e., the potential Vse) is high, the short-circuit between the second high-potential wiring 30 and the low potential wiring 28 can be detected at the timing t2 which is earlier than the timing t3 when the potential V55 reaches the reference potential Vref. For this reason, the forced turning off operation can be started at an early timing. Thus, an excessive increase in the main current can be prevented. That is, the switching element 40b can be protected from the overcurrent.

Figure 4:
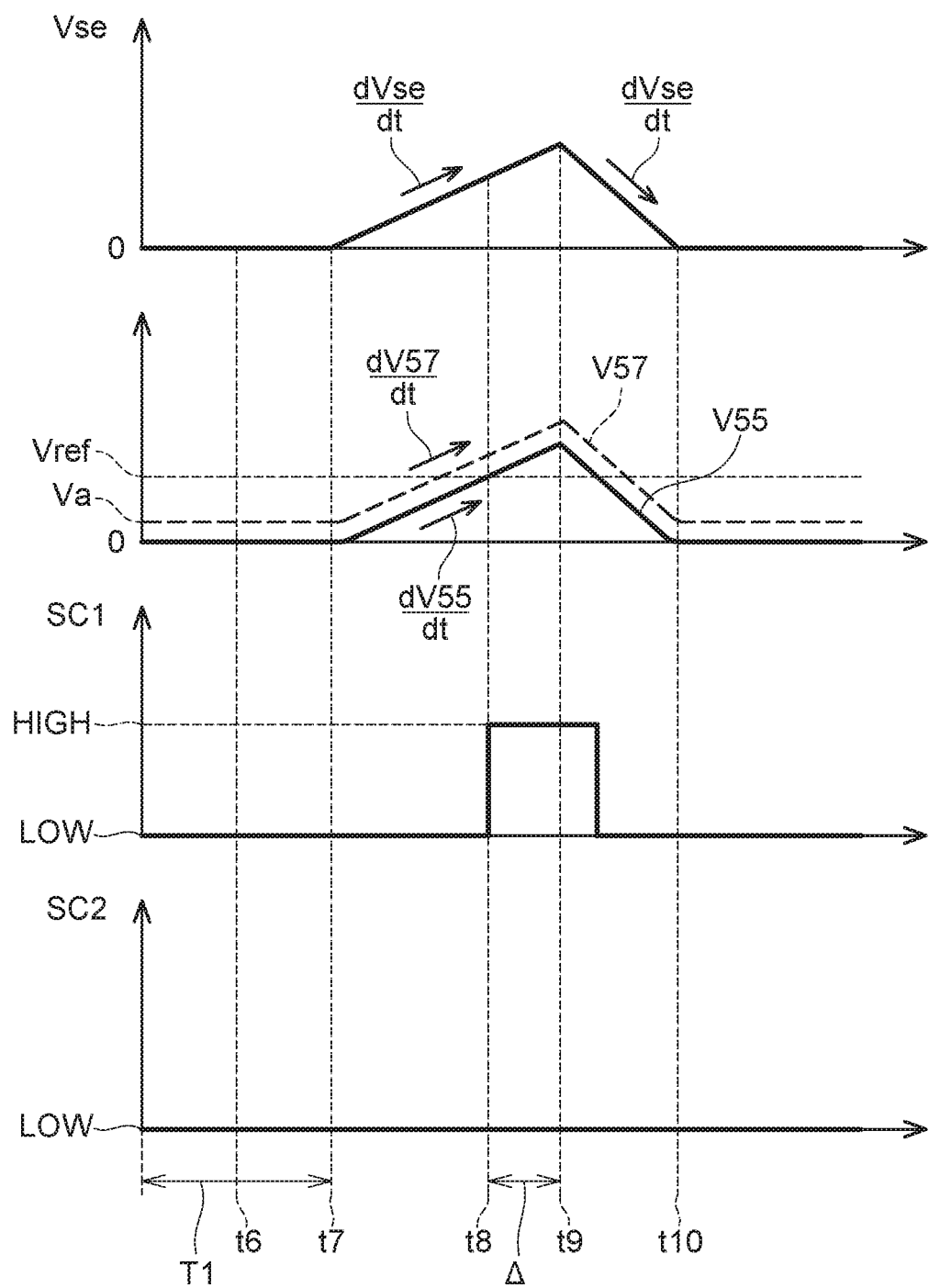
FIG. 4 is a graph showing a change in each value in type 1.

FIG. 4 shows the type 1. FIG. 4 shows a case where both the switching element 40a and the switching element 40b are turned off during a time period prior to a timing t6, the switching element 40a is short-circuited at the timing t6, and the switching element 40b is turned on at a timing t7.

In FIG. 4, the switching element 40b is turned off during a time period T1 prior to the timing t7. Although the switching element 40 is short-circuited at the timing t6, the switching element 40b nulled off during the time period T1. Due to this, a short-circuit does not occur between the second high-potential wiring 30 and the low-potential wiring 28 during the time period T1 even after the timing t6. Due to this, the main current (i.e., the potential Vse) of the switching element 40b is substantially zero during the period T1. Thus, the potential V55 is maintained at substantially zero, the potential V57 is maintained at the potential Va, the signal SC1 is at LOW, and the signal SC2 is at LOW during the time period T1.

If the switching element 40b is turned on at the timing t7, the short-circuit occurs between the second high-potential wiring 30 and the low-potential wiring 28. Due to this, the main current (i.e., the potential Vse) flowing through the switching element 40b increases rapidly after the timing t7. However, in the type 1, since the main current increases at a rate according to a switching speed of the switching element 40b, an increasing rate of the main current in the type 1 is lower than the increasing rate of the main current in the type 2. Thus, the increasing rate dVse/dt of the potential Vse is lower in FIG. 4 than in FIG. 3. In one example, the increasing rate dVse/dt in the type 1 is equal to or lower than half the increasing rate dVse/dt in the type 2. After the timing t7, the potential V55 of the first detection wiring 55 and the potential V57 of the second detection wiring 57 increases with the increase of the potential Vse. In the type 1, since the increasing rate dVse/dt is not very high, the potential V55 of the first detection wiring 55 and the potential V57 of the second detection wiring 57 increases at a rate substantially same as the increasing rate of the potential Vse. Further, an initial potential of the potential V57 (i.e., the potential Va) is higher than an initial potential of the potential V55 (i.e., 0V.) Due to this, the potential V57 is maintained higher than the potential V55 during when both potentials are increasing. Due to this, the potential V55 does not exceed the potential V57, and the comparator 62 maintains the signal SC2 at LOW. The potential V55 continues to increase and exceeds the reference potential Vref at a timing t8. Then, the comparator 60 raises the signal SC1 from LOW to HIGH at the timing t8. Thus, the gate control circuit 70 conducts a forced turning off operation of the switching element 40b, Due to this, the main current of the switching element 40b the potential Vse)) begins to decrease at a timing t9 a little later than the timing t8. The main current (i.e., the potential Vse) of the switching element 40b decreases from the timing t9 to the timing t10. It should be noted that once the signal SC1 is changed to the gate control circuit 70 maintains the switching element 40b in the turned off state thereafter. Due to this, the main current (i.e., the potential Vse) is maintained at substantially zero after the timing t10.

As described above, in type 1, since the increasing rate dVse/dt is not very high, the potential V55 and the potential V57 increase at a substantially same rate as the increasing rate of the potential Vse. It should be noted that the increasing rate dV55/dt of the potential V55 in the type 1 is equal to or lower than the increasing rate dV55/dt of the potential V55 in the type 2, and the increasing rate dV57/dt of the potential V57 in the type 1 is equal to or lower than the increasing rate dV57/dt of the potential V57 in the type 2. In the type 1 since the potential V55 and the potential V57 increase at the rates substantially equal to the increasing, rate of the potential Vse, the potential V55 does not exceed the potential V57. In the type 1, since the potential V55 exceeds the reference potential Vref due to the increase of the main current at the timing t8, the forced turning off operation begins at the timing t8. Due to this, the main current can be decreased at the timing t9. As such, in the type 1 in which the increasing rate of the main current (i.e., the potential Vse) is not very high, the short-circuit is detected when the potential V55 reaches the reference potential Vref, and thereby the forced turning off operation begins. The timing when the forced tuning off operation begins later in the type 1 as compared to the type 2 (that is, the short-circuit is detected and thereby the forced turning off operation begins at a timing when the main current (i.e., the potential Vse) increases to some extent). However, since the increasing rate of the main current is not very high, the main current does not increase so much even if the forced turning off operation does not begin so early. Due to this, also in the type 1, the main current the potential Vse) can be prevented from increasing excessively. That is, the switching element 40b can be protected from the overcurrent.

It should be noted that the gate control circuit 70 is configured to discharge the gate of the switching element 40b and to thereby turn off the switching element 40b. The decreasing rate of the potential of the gate during the forced turning off operation is higher in the type 2 than in the type 1. That is, an amount of current of the gate during the forced turning off operation is larger in the type 2 than in the type 1. For this reason, as is apparent from comparison of FIGS. 3 and 4, a time period Δt, which is from a timing when the short-circuit is detected until a timing when the main current (i.e., the potential Vse) begins to decrease, is shorter in the type 2 (i.e., FIG. 3) than in the type 1 (i.e., FIG. 4). Further, a decreasing rate of the main current (i.e., the potential Vse) during the forced tuning off operation (in FIG. 3 the decreasing rate dVse/dt during a time period from the timing t4 to the timing t5, and in FIG. 4 the decreasing rate dVse/dt during a time period from the timing t9 to the timing t10) is higher in the type 2 (i.e., FIG. 3) than in the type 1 (i.e., FIG. 4). In the type 2 where the increasing rate of the main current is high, the switching element 40b can be suitably protected from the overcurrent by discharging the gate quickly. Further, in the type 1 where the increasing rate of the main current is not very high, the switching element 40b can be suitably protected from the overcurrent even if the discharging rate of the gate is not set very high. Further, in the type 1, occurrence of noise can be suppressed by making the discharging rate of the gate lower than in the type 2.

Figure 5:
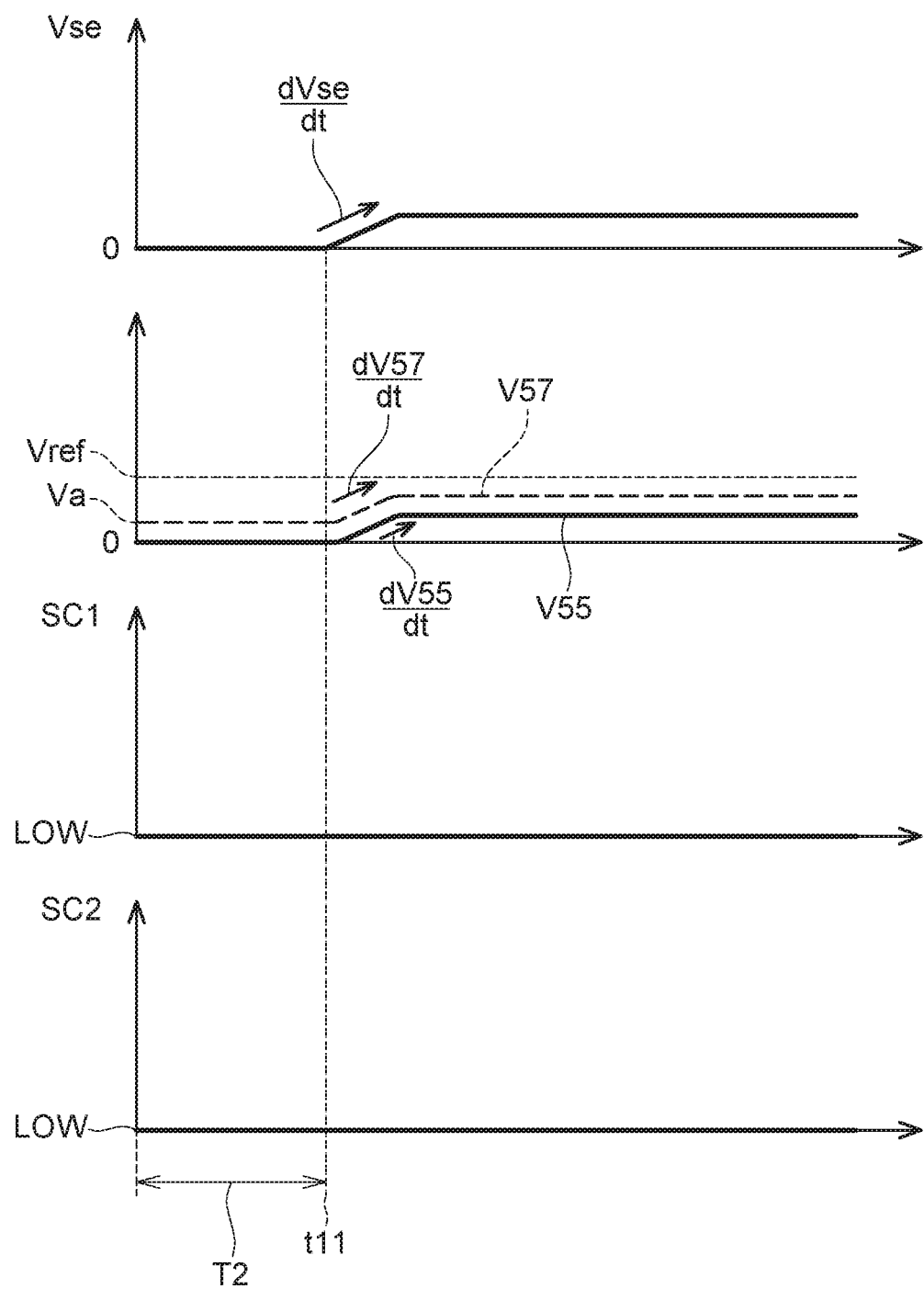
FIG. 5 is a graph showing a change in each value during a normal turning-on operation.

Further, FIG. 5 shows an operation (normal turning on operation) of turning on the switching element 40b in a case where the switching element 40a is not short-circuited. Both the switching element 40a and switching element 40b are turned off during a time period T2 prior to a timing t11. The switching element 40b is turned on at the timing t11. Then, a current flows from the first high-potential wiring 26 toward the switching element 40b, and thereby the main current the potential Vse) of the switching element 40b increases. Since the increasing rate dVse/dt of the potential Vse at this time is not very high, the potential V55 and the potential V57 increase at a rate substantial same as the increasing rate of the potential Vse. Due to this, the potential V57 is maintained higher than the potential V55, and the signal SC2 is maintained at LOW. Further, since a large main current does not flow during the normal turning on operation, the potential Vse does not increase very much, and the potential V55 does not increase very much, either. Due to this, the potential V55 does not reach the reference potential Vref. Thus, the signal SC1 is maintained at LOW. Due to this, the forced turning off operation of the switching element 40b is not conducted during the normal tuning on operation.

As described above, since the increasing rate of the main current is high in the type 2, the potential V55 and the potential V57 increase by being delayed to the increase of the potential Vse. Due to this, each of the increasing rates of the potentials V55 and the V57 depends on the corresponding time constant. Since the time constant R1C1 of the first filter circuit 54 is smaller than the time constant R2C2 of the second filter circuit 56, the potential V55 increases faster than the potential V57. Due to this, the short-circuit is detected between the second high-potential wiring 30 and the low-potential wiring 28 at a timing when the potential V55 exceeds the potential V57. Due to this, the short-circuit can be detected early, and the switching element 40b can be turned off forcibly at an early timing. Due to this, an overcurrent can be prevented in type 2 where the increasing rate of the main currents is high. Further, since the increasing rate of the main current is not very high during the normal turning on operation, the potential V55 and the potential V57 increase at a rate substantially equal to the increasing rate of the potential Vse to thereby follow the potential Vse. For this reason, the potential V55 does not exceed the potential V57 during the normal tuning on operation. Due to this, the signal SC2 is not raised to HIGH during the normal tuning on operation. The forced turning off operation is not conducted based on the signal SC2 during the normal tuning on operation. Further, since the increasing rate of the main current is not very high in the type 1, the potential V55 does not exceed the potential V57. In the type 1, the short-circuit is detected between the second high-potential wiring 30 and the low-potential wiring 28 at the timing when the potential V55 exceeds the reference potential Vref, and thereby the forced turning off operation is conducted. The forced turning off operation is conducted later in the type 1 than in the type 2. However, since the increasing rate of the main current is not very high, the switching element 40b can be protected suitably from the overcurrent. Further, since the main current does not increase to a very high value during, the normal turning on operation, the potential V55 does not exceed the reference potential Vref. Due to this, the signal SC1 is not at HIGH during the normal turning on operation. The forced turning off operation is not conducted based on the signal SC1 during the normal tuning on operation. Thus, the forced turning off operation can be prevented from being conducted during the normal turning on operation. As such, according to the switching circuit 50, the forced turning off operation can be conducted in cases of the type 1 and the type 2 without having the forced turning off operation conducted during the normal turning on operation.

Further, in the above-described embodiment, the high increasing rate of the main current is detected based on a difference between the time constants in the first filer circuit 54 and the second filter circuit 56. As another method, a configuration is conceivable where the main current is detected, which is digitally processed to obtain the increasing rate of the main current, and thereby the forced turning off operation is conducted. However, in this case, since it takes some time for A/D conversion and calculation of the increasing rate of the main current, the forced turning off operation cannot be conducted so quickly in a case where the increasing rate of the main current is high. In the switching circuit 50 of the above-described embodiment, since the digital calculations are not required, the forced turning off operation can be conducted faster. Due to this, when the increasing rate of the main current is high, the switching element 40b can be protected more suitably.

Further, as described above, the series circuit 36a is constituted of the component called as a power card (molded component sealed by the resin), while the control board 48 is constituted of a printed wiring board and electronic components mounted thereon. When the series circuit 36a (i.e., power card) and the control board 48 are connected by many wires, many terminals are also required in the power card for connecting to these wires, as a result of which the power card becomes large and complicated. Due to this, a minimum number of the wires for connecting the series circuit 36a (i.e., power card) and the control board 48 is desirable. In the above-described embodiment, since only the current detection wiring 52 (wiring connecting the power card and the control board 48) is required for detection of the increasing rate of the main current, the power card can be downsized and simple-structured compared with the conventional power cards.

In the above-described embodiment, the forced turning off operation of the switching element 40b has been described. However, a control board (control board capable of forced turning off operation) similar to the hoard described in the above-described embodiment may be connected to the switching element 40a. Further, the second high-potential wiring 30 and the low-potential wiring 28 may be short-circuited also in any of the series circuits 36b, 36c, and 36d of the inverter circuit 22 of FIG. 1. Accordingly, a control board capable of the forced tuning off operation similar to the operation in the above-described embodiment, may be connected to at least one switching element included in the series circuits 36b, 36e, and 36d. Further, a control board capable of the forced tuning off operation similar to the operation in the above-described embodiment may be connected to an element in the series circuit of the switching element and other element (e.g., diodes, reactors or the like).

Further, in the above-described embodiments, the switching circuit 50 comprises the comparator 60 and the comparator 62. However, the switching circuit 50 may not comprise the comparator 60 in a configuration where the switching element 40b is forcibly turned off only when the increasing rate of the current is high, or in a configuration where the switching element 40b is protected by another measure in the case of the type 1.

The corresponding relationship between components of the above embodiment and components of claims will be described. "Switching element 40b" in the embodiment is one example of "first switching element" of claims. "Switching element 40a" in the embodiment is one example of "second switching element" of claims. "First detection wiring 55" in the embodiment is one example of "first wiring" of claims. "First filter circuit 54" in the embodiment is one example of "first circuit" of claims. "Second detection wiring 57" in the embodiment is one example of "second wiring" of claims. "Second filter circuit 56" in the embodiment is one example of "second circuit" of claims. "Constant current source 58" and "resistor 56a" in the embodiment is one example of "potential maintaining circuit" of claims, "Gate control circuit 70" in the embodiment is one example of "control circuit" of claims, "Potential Va" in the embodiment is one example of "potential maintained by the potential maintaining circuit" of claims. "Reference potential Vref" in the embodiment is one example of "threshold value" of claims. "Emitter sense terminal SE" in the embodiment is one example of "lower potential terminal" of claims.

Some of the technical elements disclosed herein will hereinafter be enumerated. It should be noted that each of the technical elements below is independently useful.

In a switching circuit disclosed herein as an example, the control circuit may be configured to turn off the first switching element in a case where the potential of the first wiring exceeds a threshold value, and the threshold value may be higher than the potential maintained by the potential maintaining circuit.

Overcurrent having not-so-high current increasing rate may flow in some cases. In a case where the current increasing rate is not so high, since the potential of the first wiring does not become higher than the potential of the second wiring, the overcurrent cannot be detected from a relationship between the potential of the first wiring and the potential of the second wiring. Contrary to this, in the above configuration, the first switching element is turned off also when the potential of the first wiring exceeds the threshold value. The fact that the potential of the first wiring exceeds the threshold value means that a large current is flowing through the first switching element. Thus, the first switching element can be protected from the overcurrent by turning off the first switching element. In this control method, although the first switching element is turned off at a timing when a current flowing through the first switching element becomes relatively large, the first switching element can be protected from the overcurrent suitably also since the current increasing rate is not very high.

A switching circuit disclosed herein as an example may farther comprise a second switching element connected in series to the first switching element.

Such a series circuit of the first switching element and the second switching element is used in an inverter circuit and a DC-DC converter circuit. In this case, a case where the first switching element is turned on in a state where the second switching element is short-circuited will be referred to as type 1, and a case where the second switching element is short-circuited in a state where the first switching element is turned on will be referred to as type 2, and each case will be described below. In the type 2, there is a risk that overcurrent having a high current increasing rate may flow through the first switching element. In the type 1, there is a risk that overcurrent having not very high current increasing rate may flow through the first switching element. In the type 2, since the potential of the first wiring exceeds the potential of the second wiring, the control circuit turns off the first switching element forcibly. Due to this, the first switching element can be protected from the overcurrent having the high current increasing rate. In the type 1, since the potential of the first wiring exceeds the threshold value, the control circuit turns off the first switching element forcibly Due to this, the first switching element can be protected from the overcurrent having not very high current increasing rate.

In a switching circuit disclosed herein as an example, the control circuit may be configured to decrease a potential of a gate of the first switching element at a first rate in a case where the potential of the first wiring exceeds the threshold value. The control circuit may be configured to decrease the potential of the gate of the first switching element at a second rate in a case where the potential of the first wiring exceeds the potential of the second wiring. The second rate may be higher than the first rate.

Since the current increasing rate is high in the type 2, a potential of a gate of the first switching element is decreased at a high rate (second rate), and thereby the first switching element is turned off quickly. Due to this, the first switching element can be protected more suitably. In the type 1, since the current increasing rate is not very high, even if the potential of the gate of the first switching element is decreased at a relatively low rate (first rate), the first switching element can be protected suitably. Further, occurrence of noises can be suppressed by decreasing the potential of the gate of the first switching element at the relatively low rate.

In a switching circuit disclosed herein as an example, the first circuit may comprise: a first resistor connected between the current detection wiring and the first wiring; and a first capacitor connected between a first reference potential wiring and the first wiring, the first reference potential wiring is configured to receive a first reference potential. The second circuit may comprise: a second resistor connected between the current detection wiring and the second wiring; and a second capacitor connected between the first reference potential wiring and the second wiring. A relationship of $R1C1<R2C2$ may be satisfied, where R1 is a resistance of the first resistor, C1 is a capacitance of the first capacitor, R2 is a resistance of the second resistor, and C2 is a capacitance of the second capacitor.

A switching circuit disclosed herein as an example may further comprise a current sense resistor connected between a lower potential terminal of the first switching element and the first reference potential wiring. The current detection wiring may be connected to the lower potential terminal. The potential maintaining circuit may comprise a current source configured to make a current flow from a second reference potential wiring to the second wiring. The second reference potential wiring may be configured to receive a second reference potential higher than the first reference potential.

According to this configuration, a current flows from the second reference potential wiring toward the first reference potential wiring via the current source, the second wiring, the second resistor, the current detection wiring, and the current sense resistor while the first switching element is turned off. The current flows in this way, and thereby the potential of the second wiring is maintained higher than the potential of the first wiring while the first switching element is turned off.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited, to one described in the claims as filed. Moreover, the technology exemplified in the present description or drawings achieves a plurality of objects at the same time, and has technical utility by achieving one of such objects.

What is claimed is:

1. A switching circuit configured to switch a first switching element, the switching circuit comprising:
   the first switching element;
   a current detection wiring configured to receive a potential which changes depending on a current flowing through the first switching element;
   a first circuit connected between the current detection wiring and a first wiring, having a first time constant, and configured to make a potential of the first wiring follow the potential of the current detection wiring;
   a second circuit connected between the current detection wiring and a second wiring, having a second time constant larger than the first time constant, and configured to make a potential of the second wiring follow the potential of the current detection wiring;
   a potential maintaining circuit configured to maintain the potential of the second wiring at a potential higher than the potential of the first wiring while the current is not flowing through the first switching element; and
   a control circuit configured to turn off the first switching element in a case where the potential of the first wiring exceeds the potential of the second wiring.

2. The switching circuit of claim 1, wherein
   the control circuit is configured to turn off the first switching element in a case where the potential of the first wiring exceeds a threshold value, and the threshold value is higher than the potential maintained by the potential maintaining circuit.

3. The switching circuit of claim 2, further comprising a second switching element connected in series to the first switching element.

4. The switching circuit of claim 3, wherein
the control circuit is configured to decrease a potential of a gate of the first switching element at a first rate in a case where the potential of the first wiring exceeds the threshold value,
the control circuit is configured to decrease the potential of the gate of the first switching element at a second rate in a case where the potential of the first wiring exceeds the potential of the second wiring, and
the second rate is higher than the first rate.

5. The switching circuit of claim 1, wherein
the first circuit comprises:
a first resistor connected between the current detection wiring and the first wiring; and
a first capacitor connected between a first reference potential wiring and the first wiring, the first reference potential wiring being configured to receive a first reference potential,
the second circuit comprises:
a second resistor connected between the current detection wiring and the second wiring; and
a second capacitor connected between the first reference potential wiring and the second wiring, and
a relationship of R1C1<R2C2 is satisfied, where R1 is a resistance of the first resistor, C1 is a capacitance of the first capacitor, R2 is a resistance of the second resistor, and C2 is a capacitance of the second capacitor.

6. The switching circuit of claim 5, further comprising a current sense resistor connected between a lower potential terminal of the first switching element and the first reference potential wiring,
wherein
the current detection wiring is connected to the lower potential terminal, and
the potential maintaining circuit comprises a current source configured to make a current Row from a second reference potential wiring to the second wiring, the second reference potential wiring being configured to receive a second reference potential higher than the first reference potential.

* * * * *